United States Patent [19]

Miyata et al.

[11] Patent Number: 5,672,904
[45] Date of Patent: Sep. 30, 1997

[54] SCHOTTKY CARRIER DIODE WITH PLASMA TREATED LAYER

[75] Inventors: Tomoyasu Miyata, Shiga-ken; Koichi Sakamoto, Ohtsu, both of Japan

[73] Assignee: Murata Manufacturing Co., Ltd., Japan

[21] Appl. No.: 708,094

[22] Filed: Aug. 23, 1996

[30] Foreign Application Priority Data

Aug. 25, 1995 [JP] Japan .................. 7-240622

[51] Int. Cl.$^6$ ........................... H01L 23/58
[52] U.S. Cl. ................ 257/472; 257/473; 257/483; 257/484; 257/496; 257/623
[58] Field of Search ............ 257/472, 473, 257/483, 484, 496, 623

[56] References Cited

U.S. PATENT DOCUMENTS

| | | | |
|---|---|---|---|
| 3,849,789 | 11/1974 | Cordes et al. | 257/483 X |
| 3,923,975 | 12/1975 | Calviello | 257/483 X |
| 4,310,362 | 1/1982 | Roche et al. | 257/484 X |
| 4,720,734 | 1/1988 | Amemiya et al. | 257/484 |

FOREIGN PATENT DOCUMENTS 2811538  9/1978  Germany .................. 257/496

*Primary Examiner*—William Mintel

[57] ABSTRACT

A Schottky barrier diode having improved breakdown characteristics has an $n^+$ semiconductor layer and an $n^-$ semiconductor layer provided on the $n^+$ semiconductor layer. The $n^-$ semiconductor layer is configured to form a mesa. An insulating layer is formed so as to expose the upper surface of the mesa. An anode electrode is provided on the exposed surface and a side surface of the mesa, while a cathode is electrically connected to the $n^+$ layer. A plasma treated layer is provided in the $n^-$ semiconductor layer so as to extend inwardly from at least a portion of the side surface of the mesa.

9 Claims, 4 Drawing Sheets

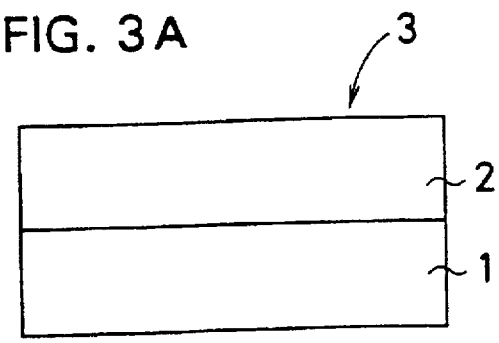
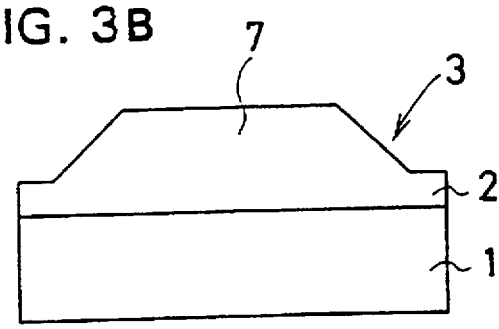
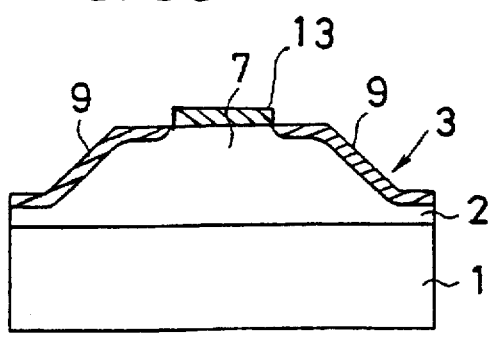
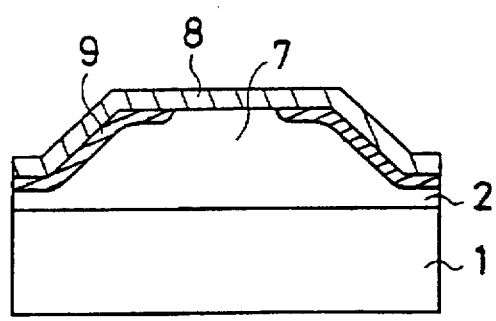
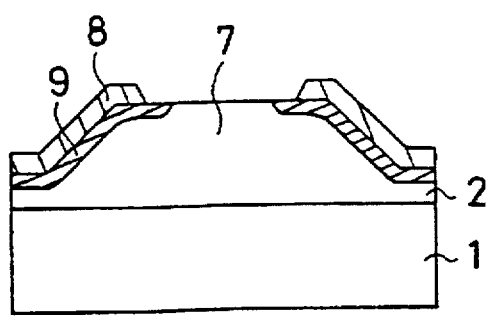
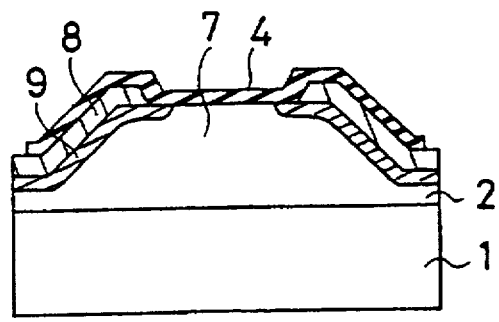

5,672,904

1

SCHOTTKY CARRIER DIODE WITH PLASMA TREATED LAYER

BACKGROUND OF THE INVENTION

1. Field of the Invention

The present invention relates to a Schottky barrier diode and, more particularly, to a Schottky barrier diode having a high breakdown voltage.

2. Description of the Related Art

FIG. 1 shows the structure of a conventional Schottky barrier diode 51. In this Schottky barrier diode 51, an anode electrode 4 is provided directly on an $n^-$ layer 2 of a GaAs substrate 3 in which the $n^-$ layer 2 is formed on the surface of an $n^+$ layer 1, and a cathode electrode 5 is provided on the $n^+$ layer 1. When a reverse bias voltage is applied across the anode electrode 4 and the cathode electrode 5, a depletion region 6 extends in the $n^-$ layer 2 from the anode electrode 4 toward the interface between the $n^-$ layer 2 and the $n^+$ layer 1, so that a current is prevented from flowing between the anode electrode 4 and cathode electrode 5. On the other hand, when a forward bias voltage is applied between the anode electrode 4 and the cathode electrode 5, the Schottky junction between the anode electrode 4 and the $n^-$ layer 2 is biased forward. A current therefore flows between the anode electrode 4 and the cathode electrode 5 without forming a depletion region in the $n^-$ layer 2. Thus, the Schottky barrier diode 51 exhibits a rectifying property.

In the Schottky barrier diode 51 having the structure as shown in FIG. 1, the application of a reverse bias voltage causes the concentration of an electric field at edge portions 4a of the $n^-$ layer 2 close to the edges of the anode electrode 4. Therefore, catastrophic breakdown at edge portions 4a is likely to happen at a low reverse bias voltage and hence the diode 51 is destroyed. It is thought that the electric field generated at the edge portions 4a of the $n^-$ layer 2 includes a component h in a direction parallel with the $n^-$ layer 2 (fringing component) besides a component v in a direction perpendicular to the $n^-$ layer 2, which increases the concentration of an electric field at edge portions 4a.

SUMMARY OF THE INVENTION

The present invention, accordingly, overcomes the aforementioned problem associated with the conventional Schottky diode and provides a Schottky diode having a structure which allows higher breakdown voltages.

A Schottky barrier diode according to an embodiment of the present invention, includes an $n^+$ semiconductor layer and an $n^-$ semiconductor layer provided on the $n^+$ semiconductor layer. The $n^-$ semiconductor layer has a lower surface and a mesa which projects from the lower surface and has an upper surface and a side surface. An insulating layer is formed on at least the side surface and a periphery of the upper surface. An anode electrode is provided on the insulating layer and a portion of the upper surface other than the periphery which is covered by the insulating layer, the anode electrode being in Schottky contact with the $n^-$ layer. A cathode electrode is provided on the $n^+$ semiconductor layer. A plasma treated layer is provided in the $n^-$ semiconductor layer so as to extend toward an inside of the $n^-$ semiconductor layer from at least a portion of the side surface of the mesa.

According to the present invention, since the plasma treated layer provided on at least a portion of the side surface of the mesa can be easily depleted under the reverse bias condition, the depletion region is evenly formed below the

2 anode electrode under the reverse bias condition. Thus, concentration of an electric field is moderated and the breakdown voltage can be improved. This makes it possible to improve the reliability of the diode.

Further, forward characteristics of a Schottky barrier diode can be improved by making the $n^-$ layer thinner or increasing the carrier density of the $n^-$ layer while the breakdown characteristics are maintained at the degree of the conventional art. As a result, the area of the anode electrode can be reduced to make the chip more compact. In addition, the reduction of the size of a chip makes it possible to increase the number of chips produced from a sheet of wafer, resulting in cost reduction.

Other features and advantages of the present invention will become apparent from the following description of the accompanying drawings. For the purpose of illustrating the invention, the drawings show several forms which are presently preferred, it being understood, however, that the invention is not limited to the precise arrangements and instrumentalities shown.

BRIEF DESCRIPTION OF THE DRAWINGS

FIGS. 3A through 3F are views illustrating a process of manufacturing the above-described Schottky barrier diode.

DETAILED DESCRIPTION OF EMBODIMENTS OF THE INVENTION

Hereinafter, several embodiments of the present invention are explained in detail with reference to the drawings.

Figure 2:
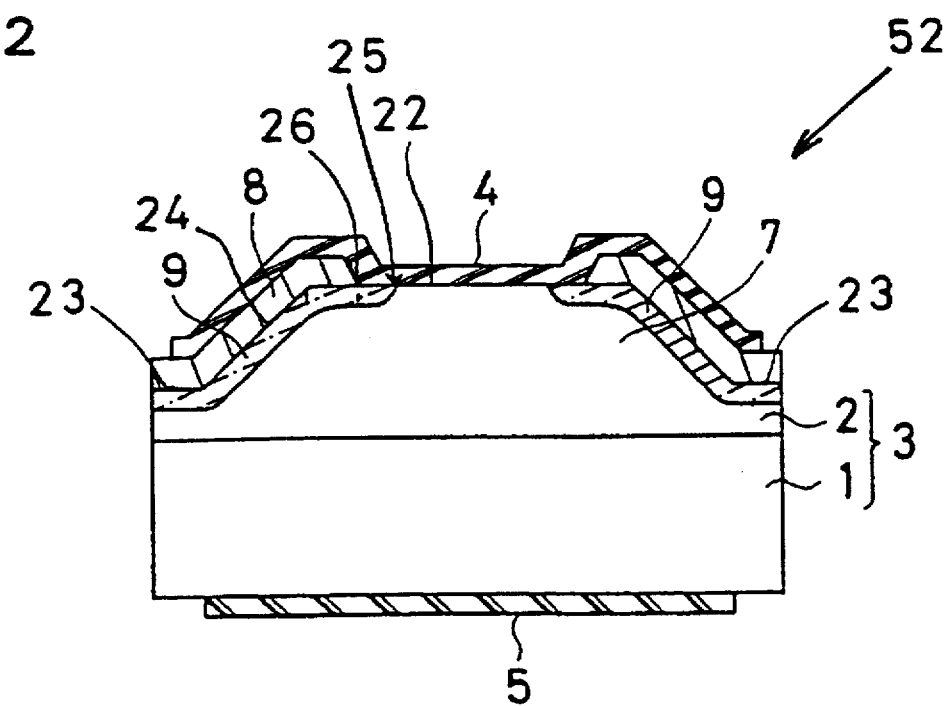
FIG. 2 is a sectional view showing a structure of a Schottky barrier diode according to one embodiment of the present invention.

FIG. 2 is a cross sectional view of a Schottky barrier diode 52 according to one embodiment of the present invention. The Schottky barrier diode 52 includes a GaAs substrate 3. The GaAs substrate 3 comprises an $n^+$ layer 1 and an $n^-$ layer 2 which is disposed on the $n^+$ layer 1. The $n^-$ layer 2 has a mesa 7 projecting upward from a lower surface 23 of the mesa 7 to an upper surface 22 of the mesa 7. The mesa 7 may be formed in any shape, such as a circular shape, a rectangular shape, and so on. The upper surface 22 of the mesa 7 is smaller than the lower surface 23 of the mesa 7, since a side surface (also called a step portion) 24 of the mesa 7 slants at an angle in the range of about 10 to 80 degrees with respect to the lower surface 23.

An insulating film 8 such as a nitride film is provided on the lower surface 23, the side surface 24 and a periphery of the upper surface 22 so as to expose a central portion of the upper surface 22. An anode electrode 4 is provided on the central portion of the upper surface 22 and over the side surface 24. The anode electrode 4 may extend to a point above the lower surface 23. Further, a cathode electrode 5 is provided on the bottom surface of the n$^+$ layer 1. The anode electrode 4 is in Schottky contact with the n$^-$ layer 2 while the cathode electrode 5 is in Ohmic contact with the n$^+$ layer 1. The essential function of the Schottky barrier diode derives from the Schottky junction between the anode electrode 4 and the n$^-$ layer 2.

As shown in FIG. 2, a plasma treated layer 9 is formed in the n$^-$ layer 2 so as to extend toward the inside of the n$^-$ layer 2 from the periphery of the upper surface 22, from the side surface 24 and from the lower surface 23. An end 25 of the plasma treated layer 9 is located closer to the center of the upper surface 22 than an end 26 of the insulating film 8. It is preferable that the plasma treated layer 9 has a thickness about 100 nm or less, and more preferably, about 50 nm or less. The plasma treated layer 9 has a surface state of about 0.6 to 0.8 eV and a density of about $1 \times 10^{14}$ cm$^{-3}$.

The Schottky barrier diode 52 can be fabricated by the following process. As shown in FIG. 3A, an n$^-$ layer 2 made of GaAs is epitaxially grown on an n$^+$ layer 1 made of GaAs by the molecular beam epitaxy method, by metal organic chemical vapor deposition, or the like, to form a GaAs substrate 3. The GaAs substrate 3 is then etched by the wet etching method to form a mesa 7 on the n$^-$ layer 2 (FIG. 3B). The degree of slant of the side surface can be controlled by selecting a kind of etchant, an etching temperature or the like.

After forming a mask layer 13 on the central portion of the upper surface 22, the top surface of the GaAs substrate 3 is subjected to a plasma generated from a gas, which may include O$_2$ (oxygen), Ar (argon) or N$_2$ (nitrogen). The plasma process preferably employs a power in the range of several tens of watts to several hundred watts which is selected so that the Schottky characteristics will not degrade. For example, the GaAs substrate 3 may be subjected to an O$_2$ plasma under the following condition.

O$_2$ flow rate: 10 sccm
Pressure: 100 mTorr
RF power: 30 W
Self-bias: 90 V
Process time: 30 min As a result of the plasma process, the plasma treated layer 9 is formed in the n$^-$ layer 2 (FIG. 3C) having a thickness about 50 nm. It is appreciated that the plasma process does not introduce impurity species into the n$^-$ layer 2. Thus, the impurity concentration of the plasma treated layer 9 is substantially same as that of the rest of the n$^-$ layer 2.

After removing the mask layer 13, the entire surface of the n$^-$ layer 2 having the mesa 7 is covered by an insulating film 8 which is a nitride film or the like (FIG. 3D). Then, the area of the insulating film 8 located on the central portion of the upper surface 22 of the mesa 7 is removed by means of wet etching to expose the central portion of the upper surface 22 (FIG. 3E), including part of the plasma treated layer 9.

Thereafter, an anode electrode 4 made of Ti/Pt/Au or the like is formed to cover the entire mesa portion 7 from above the insulating film 8 (FIG. 3F). Further, a cathode electrode 5 is formed directly on the bottom side of the GaAs substrate 3 (FIG. 2). Thus, the Schottky barrier diode 52 is completed.

The operation of the Schottky barrier diode 52 according to the present invention will now be described, and compared with that of a comparative Schottky barrier diode 53 shown in FIGS. 4 and 5, which has the same structure as that shown in FIG. 2 except that it has no plasma treated layer.

Figure 4:
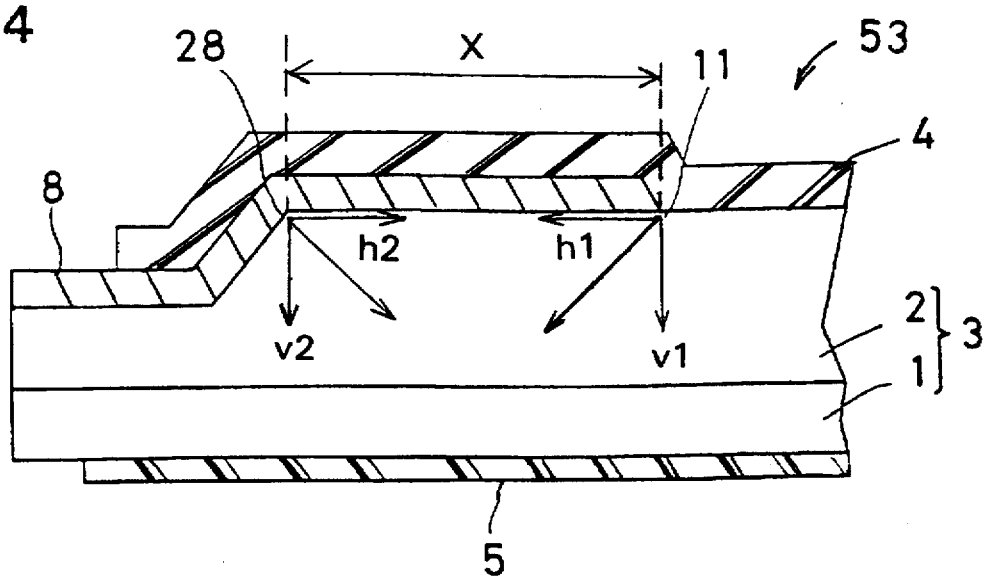
FIG. 4 is an enlarged partial sectional view of a Schottky barrier diode similar to that shown in FIG. 2, but having no plasma treated layer.
Figure 5:
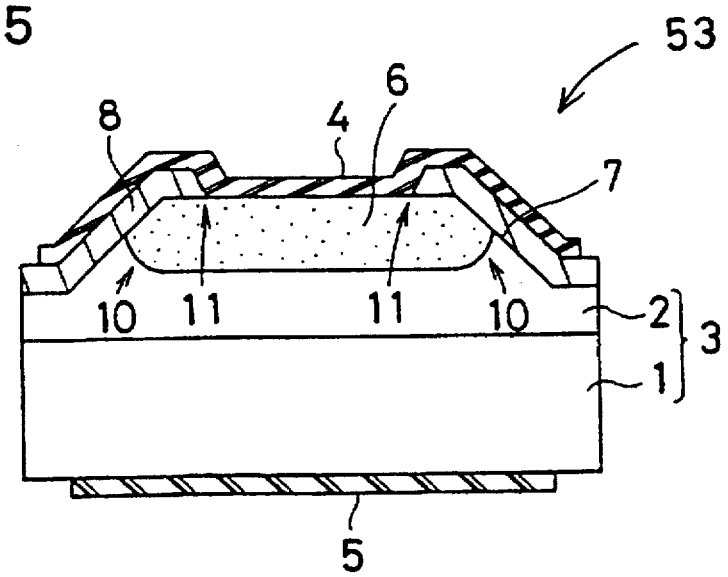
FIG. 5 is a sectional view showing a depletion region formed in the Schottky barrier diode of FIG. 4, having the same structure as that in FIG. 2 except that no plasma treated layer is formed.

As shown in FIG. 4, when a reverse bias voltage is applied between the anode electrode 4 and the cathode electrode 5 of the Schottky barrier diode 53, the electric field at the point 11 which is in the n$^-$ layer 2 and located at the edge of the region where the anode electrode 4 is in contact with the n$^-$ layer 2 is divided into a horizontal component (fringe component) h1 and a vertical component v1. The electric field at the point 28 of the n$^-$ layer 2 located at the intersection of the upper surface 22 and the side surface 24 is also divided into a horizontal component (fringe component) h2 and a vertical component v2. As is apparent from FIG. 4, the directions of the horizontal components h1 and h2 are opposite to each other and the horizontal component h1 cancels the horizontal component h2. This means the concentration of the electric field at the point 11 of the n$^-$ layer 2 is decreased. It is preferable that the insulating film 8 extends about 3 μm or less (denoted as a distance X in FIG. 4) onto the upper surface 22 of the mesa 7 so that the horizontal components h1 and h2 are canceled effectively. In this case, as shown in FIG. 5, a depletion region 6 is created in the n$^-$ layer 2. Although the depletion region 6 extends from the anode electrode 4 into the n$-$ layer 2, edges 10 of the bottom surface of the depletion region 6 do not extend fully across the n$^-$ layer 2 but rather are curved upward. This makes the distance between the edges 10 of the bottom surface of the depletion region 6 and the edges 11 of the anode electrode 4 in contact with the n$^-$ layer 2 shorter, resulting in some level of concentration of an electric field at the edges 11.

Figure 6:
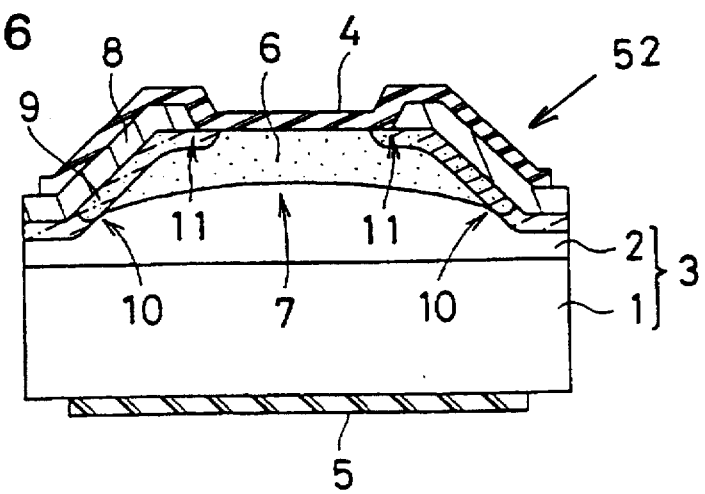
FIG. 6 is a sectional view showing a depletion region formed in the Schottky barrier diode according to the present invention.

This problem can be solved by the Schottky barrier diode 52, which has the plasma treated layer 9 in the n$^-$ layer 2. As noted above, the plasma treated layer 9 has a surface state of about 0.6 to 0.8 eV. The surface state of the plasma treated layer 9 can trap electrons, i.e., carriers, and reduce the active carrier density of the plasma treated layer 9. Therefore, the plasma treated layer 9 is easily depleted. That is, as shown in FIG. 6, when a reverse bias voltage is applied, the edges 10 of the bottom surface of the depletion region 6 extend downward because the plasma treated layer 9 is easily depleted. This increases the distance between the edges 10 and the edges 11 of the anode electrode 4 in contact with the n$^-$ layer 2, thereby further moderating the concentration of an electric field at the edges 11 of the anode electrode 4 in contact with the n$^-$ layer 2, and improving the breakdown voltage of the Schottky barrier diode 52.

Figure 1:
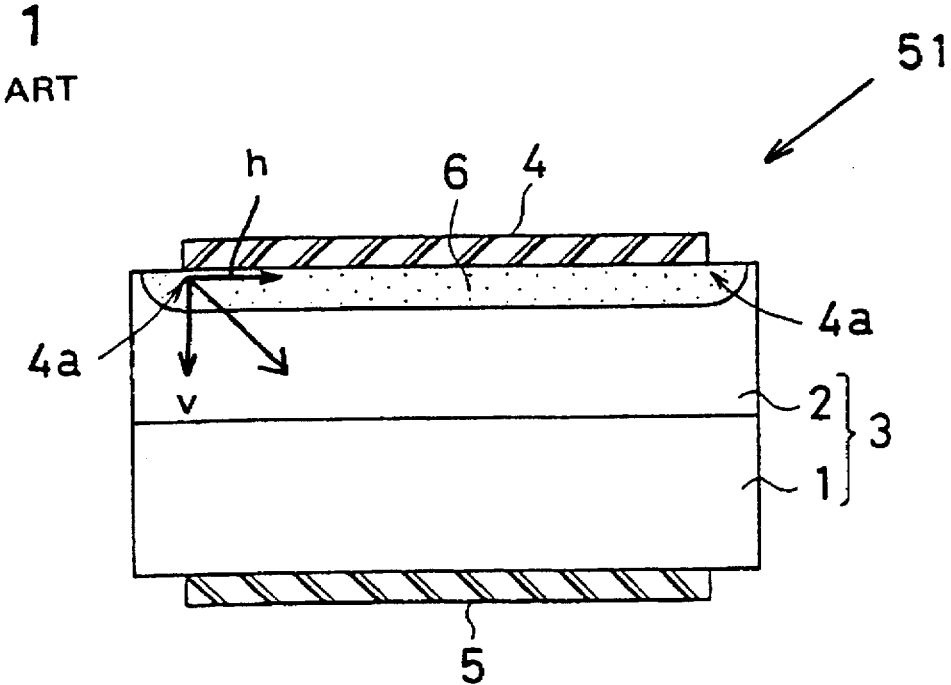
FIG. 1 is a sectional view showing a structure of a conventional Schottky barrier diode.

For example, the Schottky barrier diode 52 may have the following specifications:

Thickness of the GaAs substrate 3: 200 μm
Thickness of the n$^-$ layer 2: 10 μm
Carrier density of the n$^-$ layer 2: $2.3 \times 10^{15}$ cm$^{-3}$
Height of the mesa 7: 0.5–2.0 μm
Anode electrode 4 (region being in contact with the n$^-$ layer 2): 0.4 mm×0.4 mm In this case, it has been confirmed that the breakdown voltage can be as high as 110 volts, and this is an increase of several tens of volts in breakdown voltage over that of the Schottky barrier diode 51 having the structure shown in FIG. 1, and an increase of ten volts or more in breakdown voltage over that of the Schottky barrier diode 53 of FIGS. 4 and 5, which has the same structure as that in FIG. 2 but has no plasma treated layer.

Figure 7:
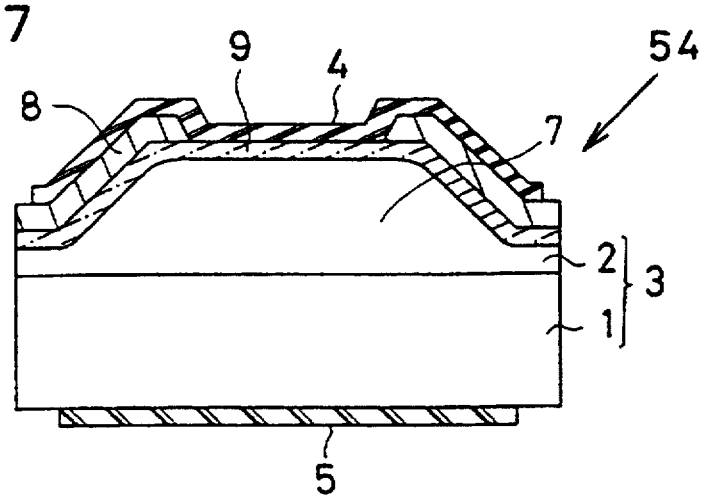
FIG. 7 is a sectional view showing a Schottky barrier diode having a plasma treated layer of another shape.

In the above-explained Schottky barrier diode 52, the plasma treated layer 9 is not formed at the central portion of the upper surface 22 of the mesa 7. However, as shown in FIG. 7, in a Schottky barrier diode 54, the plasma-applied layer 9 may be formed in the n$^-$ layer 2 from the entire surface of the n$^-$ layer 2 toward the inside thereof. The formation of the plasma treated layer 2 over the entire surface of the n⁻ layer 2 eliminates the necessity for partially masking the n- layer 2 during the plasma process, thereby allowing the plasma processing step to be simplified.

Figure 8:
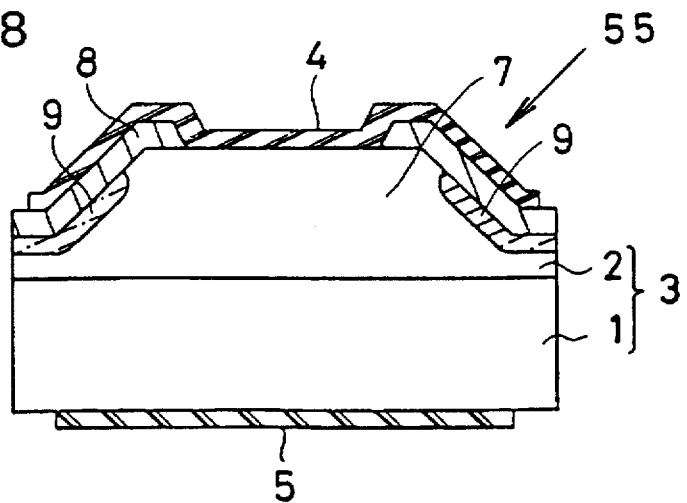
FIG. 8 is a sectional view showing a Schottky barrier diode having a plasma treated layer of still another shape.

Alternatively, as shown in FIG. 8, in a Schottky barrier diode 55, a plasma process is performed on the n⁻ layer 2 only from a lower part of the side surface 24 of the mesa 7 down to the skirt of the mesa (the lower surface 23). Thus, it is not essential to perform the plasma process on the entire side surface 24 of the mesa 7, and it may be performed only on part of the side surface 24. More particularly, plasma processing is preferably performed in those positions at or near the edges 11 of the anode electrode 4 in contact with the n⁻ layer 2 which have been empirically determined to be most effective in moderating the concentration of an electric field. For example, the process is preferably performed in a lower part of the side surface 24 as in the mode of implementation shown in FIG. 8. Further, it goes without saying that the plasma process may be performed in areas other than the side surface 24 of the mesa portion 7.

While preferred embodiments of the invention have been disclosed, various modes of carrying out the principles disclosed herein are contemplated as being within the scope of the following claims. Therefore, it is understood that the scope of the invention is not to be limited by the specific disclosure herein.

What is claimed is:

1. A Schottky barrier diode comprising:

an n⁺ semiconductor layer;

an n⁻ semiconductor layer provided on the n⁺ semiconductor layer, the n⁻ semiconductor layer having a mesa which projects upward from a lower surface of the mesa to an upper surface, and has a side surface between the upper surface and the lower surface;

an anode electrode provided on a central portion of the upper surface within a periphery thereof, the anode electrode being in Schottky contact with the n⁻ layer; and a cathode electrode provided on the n⁺ semiconductor layer;

the n⁻ semiconductor layer further comprising a plasma treated layer extending inwardly from at least a portion of the side surface of the mesa.

2. The Schottky barrier diode according to claim 1, wherein said plasma treated layer is further provided in said lower surface of the mesa.

3. The Schottky barrier diode according to claim 1, wherein the plasma treated layer is provided in the entire side and upper surfaces of the mesa.

4. The Schottky barrier diode according to claim 3, wherein said plasma treated layer is further provided in said lower surface of the mesa.

5. The Schottky barrier diode according to claim 1, wherein the plasma treated layer is further provided in a portion of said upper surface adjacent to said anode electrode.

6. The Schottky barrier diode according to claim 5, wherein said plasma treated layer is further provided in said lower surface of the mesa.

7. The Schottky barrier diode according to claim 1, wherein said plasma treated layer reduces a concentration of an electric field at an edge of a portion of the n⁻ semiconductor layer where said anode electrode contacts said n⁻ semiconductor layer.

8. The Schottky barrier diode according to claim 1, further comprising an insulating layer formed on at least the side surface and said periphery of the upper surface of the mesa, said anode electrode further extending to said insulating layer from said central portion of the upper surface.

9. The Schottky barrier diode according to claim 8, wherein said plasma treated layer reduces a concentration of an electric field at an edge of a portion of the n⁻ semiconductor layer where said anode electrode contacts said insulating layer.

* * * * *

UNITED STATES PATENT AND TRADEMARK OFFICE
CERTIFICATE OF CORRECTION

PATENT NO. : 5,672,904
DATED : September 30, 1997
INVENTOR(S) : Tomayasu Miyata, et. al.

It is certified that error appears in the above-identified patent and that said Letters Patent is hereby corrected as shown below:

Title page, item [54], and col. 1, line 1, change "CARRIER" to --BARRIER--.

Signed and Sealed this

Thirteenth Day of January, 1998

Attest:

BRUCE LEHMAN

*Attesting Officer*  *Commissioner of Patents and Trademarks*